United States Patent [19]
Chang et al.

[11] Patent Number: 5,631,188
[45] Date of Patent: May 20, 1997

[54] LOW VOLTAGE COEFFICIENT POLYSILICON CAPACITOR

[75] Inventors: Ming-Hsung Chang, Hsin-Chu; Jiue-Wen Weng, Chai-Chi, both of Taiwan

[73] Assignee: Taiwan Semiconductor Manufacturing Company Ltd., Hsin-Chu, Taiwan

[21] Appl. No.: 578,924

[22] Filed: Dec. 27, 1995

[51] Int. Cl.$^6$ .................. H01L 21/70; H01L 27/00
[52] U.S. Cl. .................. 438/253; 438/396; 438/655; 438/664
[58] Field of Search ................. 437/60, 52, 919, 437/200

[56] References Cited

U.S. PATENT DOCUMENTS

| | | | |
|---|---|---|---|
| 5,081,065 | 1/1992 | Jonkers et al. | 437/200 |
| 5,173,437 | 12/1992 | Chi | 437/60 |
| 5,356,826 | 10/1994 | Natsume | 437/60 |
| 5,397,729 | 3/1995 | Kayanuma et al. | 437/52 |
| 5,543,347 | 8/1996 | Kawano et al. | 437/60 |

*Primary Examiner*—Jey Tsai
*Attorney, Agent, or Firm*—George O. Saile; Alek P. Szecsy

[57] ABSTRACT

A method for forming a low voltage coefficient capacitor within an integrated circuit. Formed upon a semiconductor substrate is a first polysilicon layer. Formed directly upon the first polysilicon layer is an Inter Polysilicon Dielectric (IPD) layer. Formed directly upon the Inter Polysilicon Dielectric (IPD) layer is a second polysilicon layer. The first polysilicon layer and the second polysilicon layer each have a resistivity no greater than about 40 ohms per square. Formed directly upon the second polysilicon layer is an amorphous silicon layer. Formed directly upon the amorphous silicon layer is a metal layer which is capable of forming a metal silicide with the amorphous silicon layer. The thickness of the metal layer and the thickness of the amorphous silicon layer are chosen to form a stoichiometric metal silicide with minimal consumption of the polysilicon layer. Finally, the semiconductor substrate is annealed to form a metal silicide layer from the amorphous silicon layer and the metal layer.

23 Claims, 2 Drawing Sheets

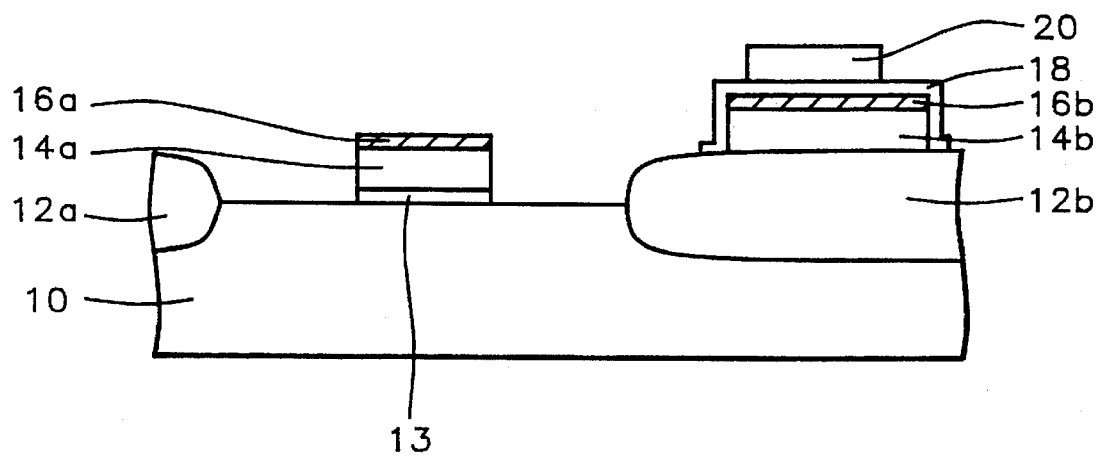
FIG. 1 – Prior Art
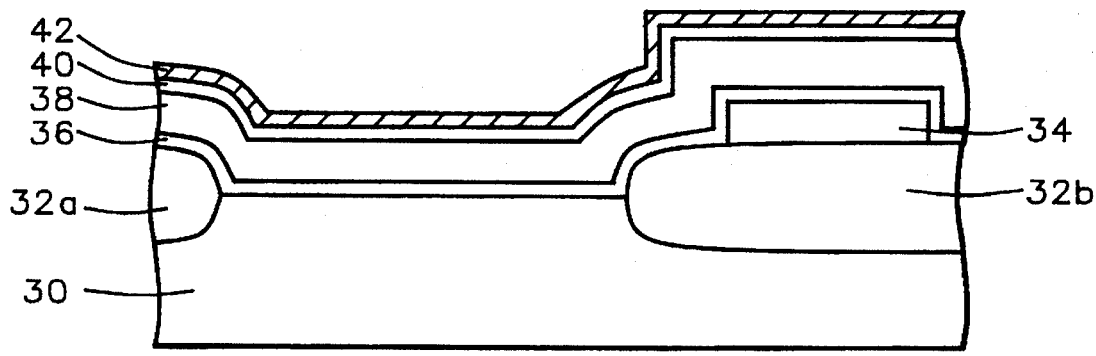
FIG. 2
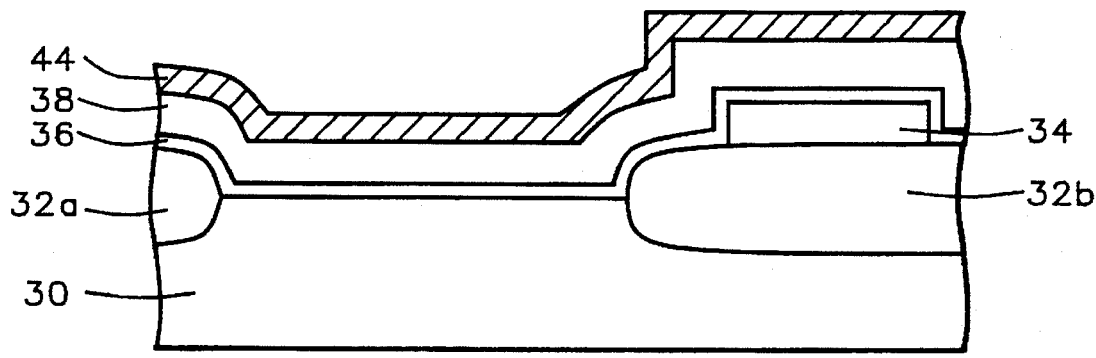
FIG. 3

LOW VOLTAGE COEFFICIENT POLYSILICON CAPACITOR

BACKGROUND OF THE INVENTION

1. Field of the Invention

The present invention relates generally to capacitors formed within integrated circuits. More particularly, the present invention relates to low voltage coefficient polysilicon capacitors formed within integrated circuits.

2. Description of the Related Art

In addition to resistors, transistors and diodes, integrated circuits of various types typically also often have capacitors formed within their fabrications. Capacitors formed within analog integrated circuit fabrications typically assure proper operation of those analog integrated circuits. Capacitors formed within digital integrated circuits typically provide charge storage locations for individual bits of digital data stored within those digital integrated circuits.

A common type of capacitor typically although not exclusively formed within an analog integrated circuit is a double layer polysilicon capacitor. Double layer polysilicon capacitors are formed from two substantially planar conductive polysilicon electrodes separated by a dielectric layer. Double layer polysilicon capacitors provide several advantages when used within integrated circuits. For example, double layer polysilicon capacitors may easily be formed within several locations within an integrated circuit. In addition, methods for forming double layer polysilicon capacitors typically provide efficient manufacturing processes since other portions of the blanket polysilicon layers from which are formed the two polysilicon electrodes within a double layer polysilicon capacitor may be employed in forming other polysilicon structures within the integrated circuit within which is formed the double layer polysilicon capacitor. Commonly, portions of one or both of the two polysilicon layers are employed in simultaneously forming: (1) polysilicon or polycide (polysilicon/metal silicide stack) gate electrodes within Field Effect Transistors (FETs), and/ or (2) polysilicon or polycide contacts within bipolar transistor electrodes, which Field Effect Transistors and/or bipolar transistors are formed within the integrated circuit within which is formed the double layer polysilicon capacitor.

When forming double layer polysilicon capacitor electrodes simultaneously from polysilicon layers which are employed in forming polysilicon or polycide (polysilicon/ metal silicide stack) gate electrodes within Field Effect Transistors (FETs), it is common in the art to encounter an integrated circuit structure similar to the integrated circuit structure generally illustrated by FIG. 1. Such integrated circuit structures are disclosed by Natsume in U.S. Pat. No. 5,356,826. Shown in FIG. 1 is a semiconductor substrate 10 within and upon whose surface is formed isolation regions 12a and 12b which define the active region of the semiconductor substrate 10. Formed upon the active region of the semiconductor substrate 10 is a polycide gate electrode formed upon a gate oxide layer 13. The polycide gate electrode is formed from a patterned first polysilicon layer 14a upon which resides a patterned metal silicide layer 16a. The patterned metal silicide layer 16a typically provides a low contact resistance to the polycide gate electrode. The patterned first polysilicon layer 14a and the patterned metal silicide layer 16a are patterned from the same blanket first polysilicon layer and blanket metal silicide layer which simultaneously form the patterned first polysilicon layer 14b and the patterned metal silicide layer 16b. Together, the patterned first polysilicon layer 14b and the patterned metal silicide layer 16b form the first polysilicon electrode of a double layer polysilicon capacitor which resides upon the isolation region 12b. Formed upon the patterned metal silicide layer 16b is a patterned insulator layer 18, and formed upon the patterned insulator layer 18 is a patterned second polysilicon layer 20. The patterned second polysilicon layer 20 forms the second polysilicon electrode of the double layer polysilicon capacitor.

Although the integrated circuit structure illustrated in FIG. 1 provides an operational double layer polysilicon capacitor, the double layer polysilicon capacitor so formed often suffers from a high voltage coefficient. The voltage coefficient of a capacitor is a parameter which measures the space-charge layer capacitance within the electrodes of a capacitor, in addition to the capacitance contribution attributable to the dielectric layer which separates the electrodes of the capacitor. In order to assure optimal performance of integrated circuits having double layer polysilicon capacitors formed therein, it is often desirable to maintain low voltage coefficients of those double layer polysilicon capacitors. It is thus in part towards the goal of maintaining low voltage coefficient double layer polysilicon capacitors that the present invention is directed.

Also known within the art of integrated circuits whose structures are similar to the integrated circuit illustrated in FIG. 1 is the phenomenon of delamination between the patterned metal silicide layer 16a and the patterned first polysilicon layer 14a, and the patterned metal silicide layer 16b and the patterned first polysilicon layer 14b. Delamination between those pairs of patterned metal silicide layers and patterned first polysilicon layers is more likely to occur as the patterned first polysilicon layer 14a and the patterned first polysilicon layer 14b become more conductive through incorporation of high dopant concentrations. Thus, it is also towards the goal of forming double layer polysilicon capacitors having at least one low contact resistance electrode with limited susceptibility to delamination that the present invention is additionally directed.

Although not necessarily directly pertinent to the goals of the present invention, various additional aspects of the methods and materials through which double layer polysilicon capacitors may be formed within integrated circuits are disclosed in the art. For example, Chi, in U.S. Pat. No. 5,173,437 discloses a two-step method employing two photolithographic masks for forming a double layer polysilicon capacitor, adjoining the edges of the lower polysilicon electrode of which are absent polysilicon stringers which otherwise might short from the polysilicon electrodes of the double layer polysilicon capacitor to other conductive elements within the integrated circuit within which is formed the double layer polysilicon capacitor.

Desirable in the art are double layer polysilicon capacitors and methods for forming those double layer polysilicon capacitors, which double layer polysilicon capacitors exhibit low voltage coefficients, and at least one of the electrodes of which double layer polysilicon capacitors has a low contact resistance and a limited susceptibility to delamination.

SUMMARY OF THE INVENTION

A first object of the present invention is to provide double layer polysilicon capacitor for use within an integrated circuit, which double layer polysilicon capacitor exhibits a low voltage coefficient.

A second object of the present invention is to provide a double layer polysilicon layer in accord with the first object of the present invention, at least one electrode of which double layer polysilicon capacitor exhibits a low contact resistance and a limited susceptibility to delamination.

A third object of the present invention is to provide a double layer polysilicon capacitor in accord with the first object of the present invention and second object of the present invention, which double layer polysilicon capacitor is also readily manufacturable.

In accord with the objects of the present invention, there is disclosed a method for forming a low voltage coefficient double layer polysilicon capacitor for use within integrated circuits. To form the double layer polysilicon capacitor of the present invention there is first formed upon a semiconductor substrate a first polysilicon layer. Formed directly upon the first polysilicon layer is an Inter Polysilicon Dielectric (IPD) layer. Formed directly upon the Inter Polysilicon Dielectric (IPD) layer is a second polysilicon layer. The first polysilicon layer and the second polysilicon layer have a resistivity of no greater than about 40 ohms per square. Formed directly upon the second polysilicon layer is an amorphous silicon layer. Formed directly upon the amorphous silicon layer is a metal layer which is capable of forming a metal silicide with the amorphous silicon layer. Finally, the semiconductor substrate is annealed to form a metal silicide from the amorphous polysilicon layer and the metal layer.

The double layer polysilicon capacitor of the present invention exhibits a low voltage coefficient. The two polysilicon electrodes of the double layer polysilicon capacitor of the present invention are formed from two polysilicon layers of resistivity no greater than about 40 ohms per square separated only by an Inter Polysilicon Dielectric (IPD) layer. The resistivities of the two polysilicon electrodes and the Inter Polysilicon Dielectric (IPD) layer are such that there is formed a double layer polysilicon capacitor which exhibits negligible space-charge layer capacitance, thus forming a double layer polysilicon capacitor having a low voltage coefficient.

At least one electrode of the double layer polysilicon capacitor of the present invention exhibits a low contact resistance and a limited susceptibility to delamination. The second polysilicon layer of the polysilicon capacitor of the present invention has formed upon its surface a metal silicide layer formed from annealing of an amorphous silicon layer and a metal silicide forming metal layer which are independently formed upon the surface of the second polysilicon layer. The metal silicide layer formed from the annealing of the amorphous silicon layer and the metal silicide forming metal layer consumes a minimal amount, if any, of the second polysilicon layer. Thus, the second polysilicon electrode, which is formed from the second polysilicon layer and the metal silicide layer, has a low contact resistance and a limited susceptibility to delamination.

The double layer polysilicon capacitor of the present invention is readily manufacturable. The double layer polysilicon capacitor of the present invention is formed through a novel ordering of integrated circuit layer formation and patterning processes which are otherwise known in the art. The double layer polysilicon capacitor requires no new materials for its manufacture. Thus, the double layer polysilicon capacitor of the present invention is readily manufacturable.

BRIEF DESCRIPTION OF THE DRAWINGS

The accompanying drawings, which form a material part of this disclosure, show the following:

FIG. 1 shows a schematic cross-sectional diagram illustrating a double layer polysilicon capacitor structure of the prior art formed within an integrated circuit.

FIG. 2 to FIG. 5 show a series of schematic cross-sectional diagrams illustrating the results of progressive stages in forming the double layer polysilicon capacitor of the present invention within an integrated circuit.

DESCRIPTION OF THE PREFERRED EMBODIMENT

The present invention provides a double layer polysilicon capacitor for use within an integrated circuit, which double layer polysilicon capacitor exhibits a low voltage coefficient. In addition, at least one electrode of the double layer polysilicon capacitor of the present invention has a low contact resistance and a limited susceptibility to delamination.

The method through which is formed the double layer polysilicon capacitor of the present invention provides that the two polysilicon layers from which are formed the two polysilicon electrodes of the double layer polysilicon capacitor of the present invention are separated by an Inter Polysilicon Dielectric (IPD) layer. The resistivity of each of the two polysilicon layers is no greater than about 40 ohms per square. The two polysilicon layers are not separated by other conductive or semi-conductive layers, such as a metal silicide layer, which might provide a space-charge capacitance to the double layer polysilicon capacitor of the present invention. Thus, the double layer polysilicon capacitor of the present invention possesses a low voltage coefficient.

At least one polysilicon electrode of the double layer polysilicon capacitor of the present invention has a low contact resistance and a limited susceptibility to delamination. At least one polysilicon electrode of the double layer polysilicon capacitor of the present invention has a metal silicide layer formed thereon, which metal silicide layer is formed from annealing an amorphous silicon layer and a silicide forming metal layer which are independently formed upon the surface of the polysilicon layer which comprises the polysilicon electrode. By forming the metal silicide layer through annealing a silicide forming metal layer with an independently deposited amorphous silicon layer there is consumed little, if any, of the polysilicon layer upon which the amorphous polysilicon layer and metal silicide forming metal layer are formed. Since little, if any, of the polysilicon layer is consumed, there is limited susceptibility to delamination.

The double layer polysilicon capacitor of the present invention will typically, although not exclusively, be formed within an analog integrated circuit within which is contained a Field Effect Transistors (FET). The double layer polysilicon capacitor may also, however, in general be formed within integrated circuits including but not limited to memory integrated circuits, logic integrated circuits, Application Specific Integrated Circuits (ASICs), integrated circuits having within their fabrications bipolar transistors and integrated circuits having within their fabrications Bipolar Complementary Metal Oxide Semiconductor (BiCMOS) transistors. The double layer polysilicon capacitor of the present invention has broad applicability within integrated circuits.

Figure 4:
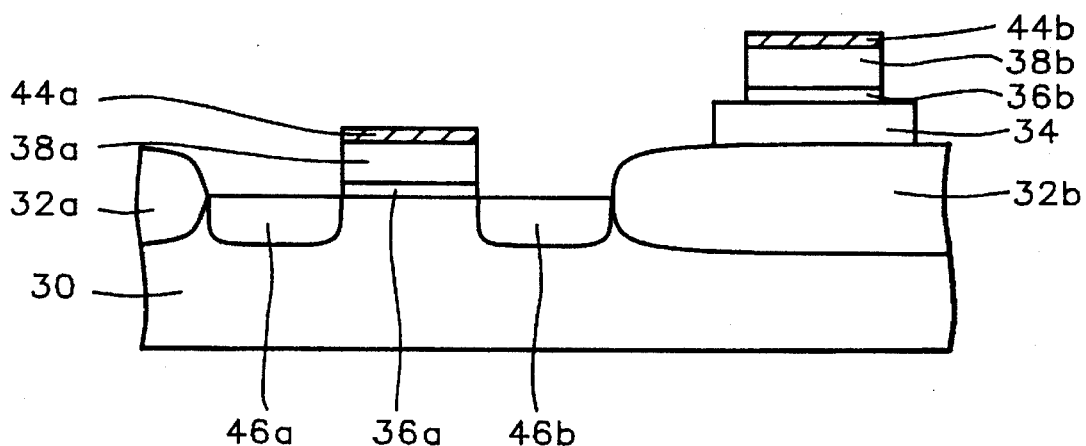

Referring now to FIG. 2 to FIG. 4 there is shown a series of schematic cross-sectional diagrams illustrating the results of progressive stages in forming the double layer polysilicon capacitor of the present invention into an integrated circuit which represents the preferred embodiment of the present invention. Shown in FIG. 2 is a schematic cross-sectional diagram illustrating the results of early stages in forming the integrated circuit.

Shown in FIG. 2 is the presence of a semiconductor substrate 30 upon and within whose surface are formed isolation regions 32a and 32b. Although the double layer polysilicon capacitor of the present invention may be formed upon semiconductor substrates of either dopant polarity, any dopant concentration and any crystallographic orientation, the double layer polysilicon capacitor of the present invention will typically be formed upon a (100) silicon semiconductor substrate having either P- or N- polarity.

Methods and materials through which isolation regions may be formed upon semiconductor substrates are known in the art. Isolation regions may be formed through methods including but not limited to selective oxidation methods whereby portions of a semiconductor substrate exposed through a suitable oxidation mask are oxidized, and selective deposition methods whereby blanket layers of insulator materials are independently formed upon the surfaces of semiconductor substrates and patterned to form isolation regions. For the preferred embodiment of the present invention, isolation regions 32a and 32b are preferably formed of silicon oxide through selective oxidation of portions of the semiconductor substrate 30 exposed through a suitable oxidation mask at a temperature of from about 970 to about 990 degrees centigrade.

Also shown in FIG. 2 is the presence of a patterned first polysilicon layer 34 which forms a first polysilicon electrode of the double layer polysilicon capacitor of the present invention. The patterned first polysilicon layer 34 is formed through patterning through methods as are conventional in the art of a blanket first polysilicon layer. The patterning may be accomplished through methods including but not limited to photolithographic methods followed by wet chemical etching methods and dry plasma Reactive Ion Etch (RIE) etch methods. As is known in the art, the blanket first polysilicon layer which is patterned to form the patterned first polysilicon layer 34 may be formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. For the preferred embodiment of the present invention, the blanket first polysilicon layer from which is formed the patterned first polysilicon layer 34 is preferably formed through a Low Pressure Chemical Vapor Deposition (LPCVD) method employing silane as a silicon source material, although other methods and materials may be employed. Preferably, the thickness of the blanket first polysilicon layer and the patterned first polysilicon layer 34 is from about 2400 to about 3000 angstroms.

In order for the patterned first polysilicon layer 34 to serve adequately as a polysilicon electrode in the low voltage coefficient double layer polysilicon capacitor of the present invention, the patterned first polysilicon layer must have a low level of resistivity, preferably no greater than about 40 ohms per square. In order to achieve this level of resistivity, substantial quantities of dopant atoms are preferably incorporated into patterned first polysilicon layer 34. Preferably, although not exclusively, the dopant atoms are incorporated into the blanket first polysilicon layer from which is patterned the patterned first polysilicon layer 34. The dopant atoms may be incorporated through methods including but not limited to Chemical Vapor Deposition (CVD) co-deposition methods, thermal diffusion methods and ion implantation methods. For the first preferred embodiment of the present invention, the resistivity requirement of the patterned first polysilicon layer 34 is preferably fulfilled through doping the blanket first polysilicon layer with phosphorus through a phosphorus oxy-chloride thermal diffusion process at a temperature of about 865 to about 885 degrees centigrade to yield a sheet resistivity of about 23 to about 27 ohms per square of the blanket first polysilicon layer from which is formed the patterned first polysilicon layer 34. Other dopant materials and doping methods may, however, alternatively be employed.

Also shown in FIG. 2 is the presence of a blanket first dielectric layer 36 upon which is formed a blanket second polysilicon layer 38. The blanket second polysilicon layer 38 and the blanket first dielectric layer 36 will subsequently be successively patterned to form, respectively, a second polysilicon electrode and an Inter Polysilicon Dielectric (IPD) layer of the double layer polysilicon capacitor of the present invention. The blanket second polysilicon layer 38 is preferably formed through methods and materials analogous to the methods and materials through which is formed the blanket first polysilicon layer. Specifically, the blanket second polysilicon layer 38 preferably also has a resistivity of no greater than about 40 ohms per square. Preferably, the blanket second polysilicon layer 38 has a thickness of from about 1350 to about 1650 angstroms.

Methods and materials through which blanket dielectric layers may be formed within integrated circuits are known in the art. Blanket dielectric layers may be formed from materials including but not limited to silicon oxide materials, silicon nitride materials and silicon oxynitride materials formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods. For the preferred embodiment of the present invention, the blanket first dielectric layer 36 is preferably formed of a dielectric material chosen from the group of dielectric materials consisting of silicon oxide dielectric materials, silicon nitride dielectric materials and silicon oxynitride dielectric materials. Preferably, the blanket first dielectric layer 36 is from about 340 to about 400 angstroms thick.

Finally, there is shown in FIG. 2 the presence of a blanket amorphous silicon layer 40 upon which resides a blanket metal layer 42. The blanket amorphous silicon layer 40 and the blanket metal layer 42 will subsequently be annealed to form a blanket metal silicide layer. Methods and materials through which blanket amorphous silicon layers and blanket metal layers may be formed upon semiconductor substrates are known in the art. Blanket amorphous silicon layers and blanket metal layers may be formed upon semiconductor substrates through methods including but not limited to thermal evaporation methods, Chemical Vapor Deposition (CVD) methods and Physical Vapor Deposition (PVD) sputtering methods employing suitable silicon, metal or metal precursor source materials.

For the preferred embodiment of the present invention, the blanket amorphous silicon layer 40 is preferably formed through a Chemical Vapor Deposition (CVD) method employing silane as a silicon source material, although other methods and materials may be employed. Preferably, the thickness of the amorphous silicon layer 40 is from about 150 to about 250 angstroms. For the preferred embodiment of the present invention, the blanket metal layer 42 is preferably formed of a metal from which a metal silicide may be formed through reaction with the blanket amorphous silicon layer 40. Thus, although there are in general many metals through which blanket metal layers may be formed within integrated circuits, the selections of metal for forming the blanket metal layer 42 are more limited. Preferably, the blanket metal layer 42 is formed from a silicide forming metal chosen from the group of silicide forming metals consisting of tungsten, titanium, tantalum cobalt and platinum. Preferably the blanket metal layer 42 is formed at a thickness of from about 300 to about 500 angstroms. Preferably, the thicknesses of the blanket metal layer 42 and the blanket amorphous silicon layer 44 are chosen such that a stoichiometric blanket metal silicide layer is formed from annealing of those two layers, with limited excess amorphous silicon layer 44 remaining upon annealing, and limited, if any, consumption of the blanket second polysilicon layer 38.

Referring now to FIG. 3, there is shown a schematic cross-sectional diagram which illustrates the results of further processing of the integrated circuit structure illustrated in FIG. 2. Shown in FIG. 3 is the presence of a blanket metal silicide layer 44 which results from the thermal annealing of the blanket metal layer 42 and the blanket amorphous silicon layer 40 illustrated in FIG. 2. Methods through which semiconductor substrates and integrated circuit layers upon those semiconductor substrates may be annealed are known in the art. Such methods include but are not limited to purely thermal annealing methods and flash annealing methods which employ intense light sources of wavelength which is readily absorbed and dissipated as thermal energy. For the preferred embodiment of the present invention, the blanket amorphous silicon layer 40 and the blanket metal layer 42 are preferably annealed to form the blanket metal silicide layer 44 through a thermal method at a temperature of from about 700 to about 800 degrees centigrade for a time period of from about 30 to about 60 seconds.

Referring now to FIG. 4 there is shown the results of further processing of the integrated circuit whose structure is illustrated in FIG. 3. Shown in FIG. 4 is the results of patterning the blanket metal silicide layer 44, the blanket second polysilicon layer 38 and the blanket first dielectric layer 36 illustrated in FIG. 3. Resulting from the patterning are the polycide gate electrode which resides upon the gate dielectric layer 36a. The polycide gate electrode is formed from the patterned second polysilicon layer 38a upon which resides the patterned metal silicide layer 44a. Simultaneously formed through the same patterning is the Inter Polysilicon Dielectric (IPD) layer 36b which resides beneath the second polysilicon electrode which is formed from the patterned second polysilicon layer 38b upon which resides the patterned metal silicide layer 44b.

The patterned first polysilicon layer 34, the Inter Polysilicon Dielectric (IPD) layer 36b, the patterned second polysilicon layer 38b and the patterned metal silicide layer 44b form the double layer polysilicon capacitor of the present invention. The double layer polysilicon capacitor of the present invention has a low voltage coefficient due to the absence of a space-charge region within the portions of both the first polysilicon electrode and second polysilicon electrode which adjoin the Inter Polysilicon Dielectric (IPD) layer 36b. In addition, the second polysilicon electrode of the double layer polysilicon capacitor of the present invention possesses a low contact resistance and a limited susceptible to delamination, since little, if any, of the patterned second polysilicon layer 38b is consumed in forming the patterned metal silicide layer 44b within the double layer polysilicon capacitor of the present invention.

Finally, there is shown in FIG. 4 the presence of source/drain electrodes 46a and 46b. Along with the gate dielectric layer 36a and the polycide gate electrode formed from the patterned second polysilicon layer 38a and the patterned metal silicide layer 44a, the source/drain electrodes 46a and 46b form a Field Effect Transistor (FET). Methods and materials through which source/drain electrodes may be formed within integrated circuits are known in the art. Source/drain electrodes are typically formed through ionization and implantation of dopant atoms of sufficient dose and energy to form into the surface of a semiconductor substrate an area of sufficient conductivity to form a source/drain electrode. Arsenic dopant atoms, phosphorus dopant atoms and boron dopant atoms are common dopant atoms in the art of forming source/drain electrodes. For the preferred embodiment of the present invention, arsenic dopant atoms, phosphorus dopant atoms or boron dopant atoms may be employed in forming the source/drain electrodes 46a and 46b, preferably through ion implantation at a dose of from about 3.0E15 to about 5.0E15 dopant atoms per square centimeter and at an ion implantation energy of from about 30 to about 60 keV.

Figure 5:
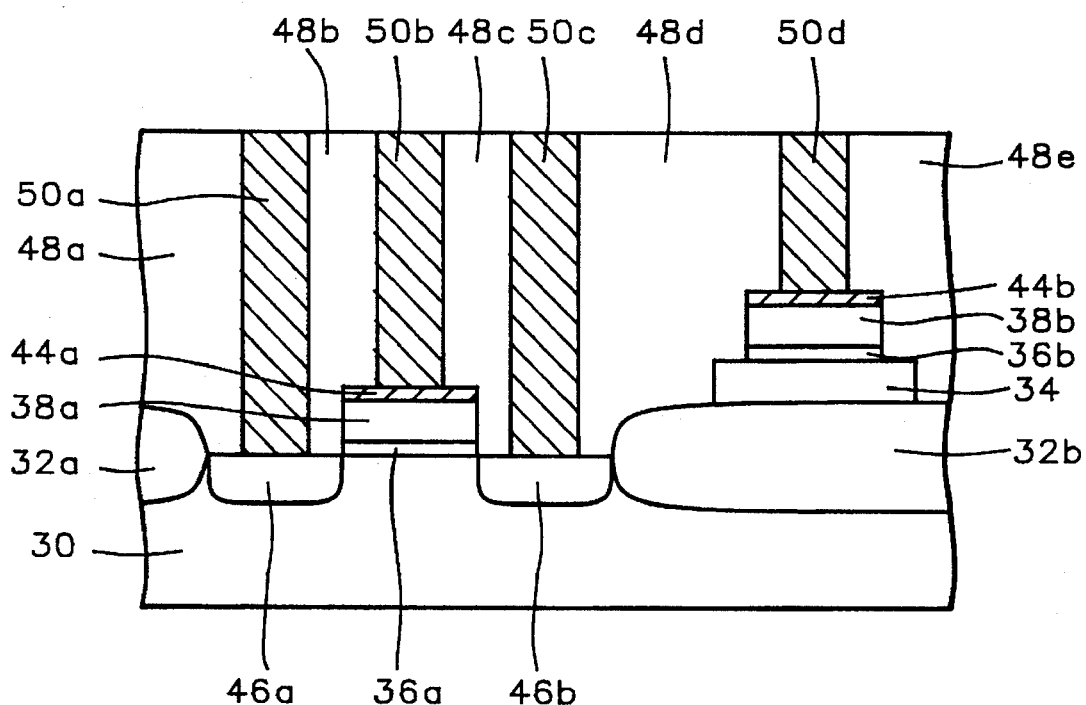

Referring now to FIG. 5 there is shown a schematic cross-sectional diagram illustrating the results of further processing of the integrated circuit whose structure is illustrated in FIG. 4. Shown in FIG. 5 is the presence of patterned planarized second dielectric layers 48a, 48b, 48c, 48d and 48e formed upon the surface of the integrated circuit whose structure is illustrated in FIG. 4. Methods and materials through which patterned planarized dielectric layers may be formed within integrated circuits are known in the art. Patterned planarized dielectric layers may be formed through patterning and planarizing through methods as are known in the art of conformal dielectric layers. Such conformal dielectric layers may be formed through methods and materials including but not limited to Chemical Vapor Deposition (CVD) methods, Plasma Enhanced Chemical Vapor Deposition (PECVD) methods and Physical Vapor Deposition (PVD) sputtering methods through which may be deposited silicon oxide dielectric materials, silicon nitride dielectric materials and silicon oxynitride dielectric materials. Such conformal dielectric layers may then be planarized through methods including but not limited to Chemical Mechanical Polish (CMP) planarizing methods and Reactive Ion Etch (RIE) etchback planarizing methods, and subsequently be patterned through photolithographic methods which include but are not limited to wet chemical etch methods and dry plasma Reactive Ion Etch (RIE) etch methods.

For the preferred embodiment of the present invention, the patterned planarized second insulator layers 48a, 48b, 48c, 48d and 48e are: (1) preferably formed of a silicon oxide insulator material deposited through a Plasma Enhanced Chemical Vapor Deposition (PECVD) method, (2) preferably planarized through a Chemical Mechanical Polish (CMP) planarizing method, and (3) preferably patterned through a Reactive Ion Etch (RIE) etch method, as is common in the art. Alternative methods and materials may, however, be employed in forming, planarizing and patterning the patterned planarized second insulator layers 48a, 48b, 48c, 48d and 48e.

Finally, there is shown in FIG. 5 the presence of conductive contact studs 50a, 50b, 50c and 50d, which contact, respectively, the source/drain electrode 46a, the patterned metal silicide layer 44a, the source/drain electrode 46b and the patterned metal silicide layer 44b. Conductive contact studs are known in the art of semiconductor manufacture. Conductive contact studs are typically formed of conductive materials including but not limited to metals, metal alloys and highly doped polysilicon. Conductive contact studs are also typically, but not exclusively, formed within apertures between patterned insulator layers within integrated circuits through methods including but not limited to thermal evaporation methods, electron beam assisted evaporation methods, Physical Vapor Deposition (PVD) sputtering methods and Chemical Vapor Deposition (CVD) methods.

For the preferred embodiment of the present invention, the conductive contact studs 50a, 50b, 50c and 50d are preferably formed of tungsten metal deposited into the apertures between the patterned planarized second insulator layers 48a, 48b, 48c, 48d and 48e through a Chemical Vapor Deposition (CVD) method, as is common in the art. The conductive contact studs 50a, 50b, 50c and 50d are preferably formed of sufficient thickness to reach the upper surfaces of the patterned planarized second insulator layers 48a, 48b, 48c, 48d and 48e.

Upon forming the integrated circuit structure illustrated in FIG. 5 there is formed the double layer polysilicon capacitor of the present invention within an integrated circuit which represents the preferred embodiment of the present invention. The double layer polysilicon capacitor within the preferred embodiment of the present invention has a low voltage coefficient. In addition, the double layer polysilicon capacitor within the preferred embodiment of the present invention also has at least one electrode exhibiting a low contact resistance and a limited susceptibility to delamination.

As is understood by a person skilled in the art, the preferred embodiment of the present invention is illustrative of the double layer polysilicon capacitor of the present invention rather than limiting of the double layer polysilicon capacitor of the present invention. Revisions may be made to methods, materials, structures and dimensions through which is formed the double layer polysilicon capacitor within the preferred embodiment of the present invention while still forming a double layer polysilicon capacitor which is within the spirit and scope of the present invention.

What is claimed is:

1. A method for forming a polysilicon electrode for use within a polysilicon capacitor comprising:

forming upon a semiconductor substrate a polysilicon layer;

forming upon the polysilicon layer an amorphous silicon layer;

forming upon the amorphous silicon layer a metal layer, the metal layer being formed from a metal from which a metal silicide is formed; and annealing the metal layer and the amorphous silicon layer to form the metal silicide, where the thickness of the metal layer and the thickness of the amorphous silicon layer are chosen to form a stoichiometric metal silicide with minimal consumption of the polysilicon layer.

2. The method of claim 1 wherein the polysilicon layer has a thickness of from about 1350 to about 1650 angstroms.

3. The method of claim 1 wherein the polysilicon layer has a resistivity of no greater than about 40 ohms per square.

4. The method of claim 1 wherein the amorphous silicon layer is formed through a Chemical Vapor Deposition (CVD) method.

5. The method of claim 1 wherein the thickness of the amorphous silicon layer is from about 150 to about 250 angstroms.

6. The method of claim 1 wherein the metal layer is formed from a silicide forming metal chosen from the group of silicide forming metals consisting of tungsten, titanium, tantalum, cobalt and platinum.

7. The method of claim 1 wherein the thickness of the metal layer is from about 300 to about 500 angstroms.

8. The method of claim 1 wherein the annealing is undertaken at a temperature of from about 700 to about 800 degrees centigrade for a time period of from about 30 to about 60 seconds.

9. A method for forming a double layer polysilicon capacitor comprising:

forming upon a semiconductor substrate a first polysilicon layer;

forming directly upon the first polysilicon layer an Inter Polysilicon Dielectric (IPD) layer;

forming directly upon the Inter Polysilicon Dielectric (IPD) layer a second polysilicon layer;

forming directly upon the second polysilicon layer an amorphous silicon layer;

forming directly upon the amorphous silicon layer a metal layer, the metal layer being formed from a metal which forms a metal silicide layer through reaction with the amorphous silicon layer; and, annealing the semiconductor substrate to form the metal silicide from the amorphous silicon layer and the metal layer, where the thickness of the metal layer and the thickness of the amorphous silicon layer are chosen to form a stoichiometric metal silicide with minimal consumption of the polysilicon layer.

10. The method of claim 9 wherein the first polysilicon layer has a thickness of from about 2400 to about 3000 angstroms and a resistivity no greater than about 40 ohms per square.

11. The method of claim 9 wherein the Inter Polysilicon Dielectric (IPD) layer is formed from a dielectric material chosen from the group of dielectric materials consisting of silicon oxide dielectric materials, silicon nitride dielectric materials and silicon oxynitride dielectric materials.

12. The method of claim 9 wherein the Inter Polysilicon Dielectric (IPD) layer has a thickness of from about 340 to about 400 angstroms.

13. The method of claim 9 wherein the second polysilicon layer has a thickness of from about 1350 to about 1650 angstroms and a resistivity of no greater than about 40 ohms per square.

14. The method of claim 9 wherein the amorphous silicon layer has a thickness of from about 150 to about 250 angstroms.

15. The method of claim 9 wherein the metal layer is formed from a silicide forming metal chosen from the group of silicide forming metals consisting of tungsten, titanium, tantalum, cobalt and platinum, and the metal layer has a thickness of from about 300 to about 500 angstroms.

16. The method of claim 9 wherein the annealing is undertaken at a temperature of from about 700 to about 800 degrees centigrade for a time period of from about 30 to about 60 seconds.

17. A method for forming a double layer polysilicon capacitor within an integrated circuit comprising:

forming upon a semiconductor substrate an integrated circuit, the integrated circuit having a minimum of one transistor formed therein;

forming upon the semiconductor substrate a first polysilicon layer;

forming directly upon the first polysilicon layer an Inter Polysilicon Dielectric (IPD) layer;

forming directly upon the Inter Polysilicon Dielectric (IPD) layer a second polysilicon layer;

forming directly upon the second polysilicon layer an amorphous silicon layer;

forming directly upon the amorphous silicon layer a metal layer, the metal layer being formed from a metal which forms a metal silicide layer through reaction with the amorphous silicon layer; and, annealing the semiconductor substrate to form the metal silicide from the amorphous silicon layer and the metal layer, where the thickness of the metal layer and the thickness of the amorphous silicon layer are chosen to form a stoichiometric metal silicide with minimal consumption of the polysilicon layer.

18. The method of claim 17 wherein the transistor is a Field Effect Transistor (FET).

19. The method of claim 17 wherein the first polysilicon layer has a thickness of from about 2400 to about 3000 angstroms and a resistivity no greater than about 40 ohms per square.

20. The method of claim 17 wherein the Inter Polysilicon Dielectric (IPD) layer is formed from a dielectric material chosen from the group of dielectric materials consisting of silicon oxide dielectric materials, silicon nitride dielectric materials and silicon oxynitride dielectric materials, and wherein the Inter Polysilicon Dielectric (IPD) layer has a thickness of from about 340 to about 400 angstroms.

21. The method of claim 17 wherein the second polysilicon layer has a thickness of from about 1350 to about 1650 angstroms and a resistivity of no greater than about 40 ohms per square.

22. The method of claim 17 wherein the amorphous silicon layer has a thickness of from about 150 to about 250 angstroms.

23. The method of claim 17 wherein the metal layer is formed from a metal chosen from the group of metals consisting of tungsten, titanium, tantalum, cobalt and platinum, and the metal layer has a thickness of from about 300 to about 400 angstroms.

* * * * *